United States Patent
Kishi et al.

(10) Patent No.: US 7,160,387 B2
(45) Date of Patent: Jan. 9, 2007

(54) HIGH PURITY SILICA CRUCIBLE BY ELECTROLYTIC REFINING, AND ITS PRODUCTION METHOD AND PULLING METHOD

(75) Inventors: Hiroshi Kishi, Akita (JP); Masanori Fukui, Akita (JP); Yoshiyuki Tsuji, Akita (JP)

(73) Assignee: Japan Super Quartz Corporation, Tokyo (JP)

( * ) Notice: Subject to any disclaimer, the term of this patent is extended or adjusted under 35 U.S.C. 154(b) by 293 days.

(21) Appl. No.: 10/781,682

(22) Filed: Feb. 20, 2004

(65) Prior Publication Data
US 2005/0000404 A1   Jan. 6, 2005

(30) Foreign Application Priority Data
Apr. 2, 2003   (JP) .............................. 2003-098770

(51) Int. Cl.
*C30B 13/06*   (2006.01)
(52) U.S. Cl. ............................ 117/13; 117/20; 117/208; 117/213; 117/900; 117/932; 65/17.3
(58) Field of Classification Search ................. 117/13, 117/20, 208, 213, 900, 932; 65/17.3
See application file for complete search history.

(56) References Cited
U.S. PATENT DOCUMENTS 5,989,021 A * 11/1999 Sato et al. .................. 432/264
6,553,787 B1 * 4/2003 Akiho et al. .................. 65/17.3
2003/0012898 A1 * 1/2003 Kemmochi et al. ......... 428/34.4
2003/0012899 A1 * 1/2003 Kemmochi et al. ......... 428/34.6
2004/0040497 A1 * 3/2004 Kemmochi et al. .......... 117/200
2004/0072007 A1 * 4/2004 Kemmochi et al. .......... 428/544

FOREIGN PATENT DOCUMENTS

JP     2000-159593    *   6/2000

\* cited by examiner

*Primary Examiner*—Robert Kunemund
(74) *Attorney, Agent, or Firm*—Oblon, Spivak, McClelland, Maier & Neustadt, P.C.

(57) ABSTRACT

This invention provides a high purity silica crucible having low impurity concentration in its inner portion, and its production method. The crucible, in which at least each content of Na and Li being contained in the depth of 1 mm from the inside surface is less than 0.05 ppm, is given by a production method of a high purity silica glass crucible, wherein a purity of the melted silica powder layer is increased by applying a voltage between a mold and an arc electrode to move impurity metals being contained in the melted silica glass layer to the outside, when the silica crucible is produced by arc plasma heating a raw material powder of silica in an inside surface of a hollow rotary mold. The method comprises, keeping an arc electrode potential of within ±500 V during an arc melting, applying a voltage of from −1000 V to −20000 V to a mold being insulated to the ground, and applying a high voltage to the un-melted silica powder layer of the outside.

18 Claims, 2 Drawing Sheets

[Figure 1]
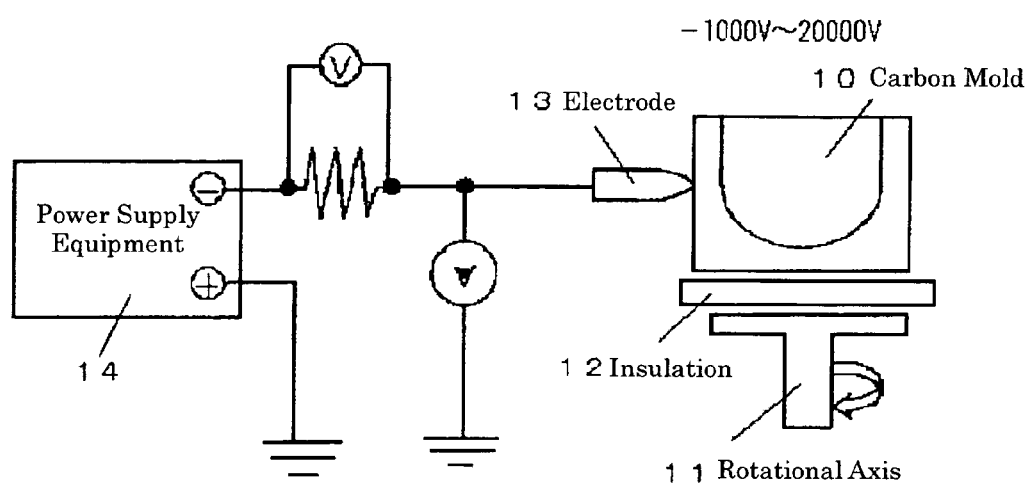

[Figure 2]
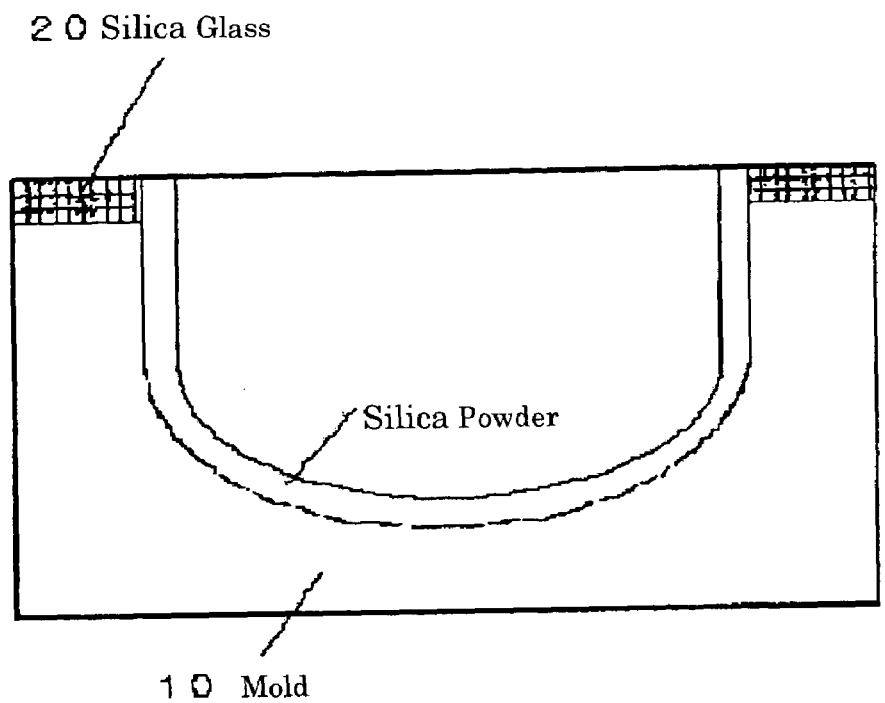
[Figure 3]
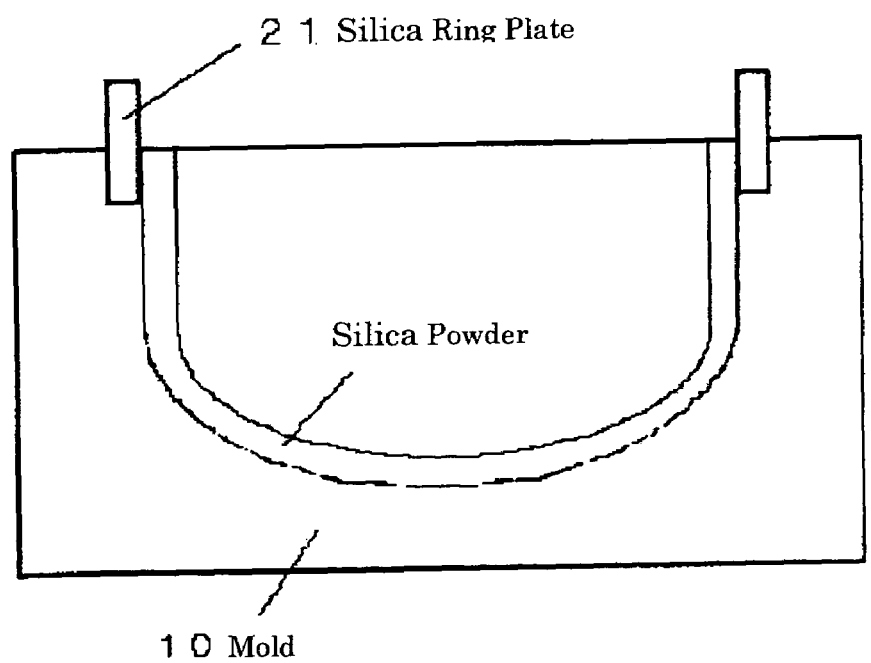

HIGH PURITY SILICA CRUCIBLE BY ELECTROLYTIC REFINING, AND ITS PRODUCTION METHOD AND PULLING METHOD

BACKGROUND OF THE INVENTION

1. Field of the Invention

The present invention relates to a silica glass crucible having high purity in its inner portion, and its production method, wherein said silica glass crucible is used for pulling a single silicon crystal being used to a semiconductor etc. from the melted silicon. In addition, the present invention also relates to a pulling method using said silica glass crucible.

2. Discussion of the Prior Art

A little amount of alkali metals has been contained in natural silica. When the silica glass containing said alkali metals is used as a heat treating substance for semiconductor industries etc., the substance is deformed or devitrified easily. Moreover, in the case of using for the silica glass crucible for pulling the single silicon crystal, there is a problem that the quality of the single silicon crystal is affected with the impurities, such as alkali metals etc., being contained in the crucible.

As means for solving such problems, it has been proposed that the silica crucible, in which the inside of the crucible is formed with the high purity synthetic silica glass layer and the outside of crucible is formed with the natural silica having a comparatively high strength. However, since the temperature and using time of the crucible at the time of pulling are under a severe condition by the enlargement of the pulled single crystal, there are new problems that the alkali metals etc. being contained in the natural silica glass layer in the outside of the crucible is diffused to the synthetic silica glass layer in the inner and dissolved to silicon melt, to give bad effects to the quality of the single silicon crystal. On the other hand, when the whole of the crucible is made with the high purity synthetic silica glass, the problem about the impurity diffusion is solved, but in the present condition, since the synthetic silica glass has very lower viscosity than that of the natural silica, the whole of the crucible made with the synthetic silica glass is deformed or buckled easily, so that said crucible can not be used for long time.

Moreover, for requiring the high performance silica glass crucible, it has been in the tendency that the temperature for melting the glass becomes high. When the temperature becomes high, the viscosity is decreased to vent air bubbles easily and a concentration of OH groups of the silica glass becomes low. As the result, there are problems that the impurity is concentrated on the inside surface of the crucible by the vaporization of SiO, and the impurities, such as alkali metals etc., is diffused from the natural layer in the outside of the crucible to the high purity synthetic layer in the inside of crucible during the arc melting, as described above. When HF etching is carried out to remove such impurities being contained in the inside surface of the crucible, it takes time very much, and in addition, an irregularity, which is said to as HF cracks in general, is generated on the surface by the HF washing for long time, so that the yield of the single crystal becomes to be decreased on the contrary.

[Problems to be Solved]

In such a situation, as for the produced silica crucible or the producing silica crucible, it has been proposed that the method, in which the alkali metals etc. are moved to the outside of crucible by applying the voltage to decrease the concentration of these metals in the inside of crucible (Japanese Patent Publication No. H07-84328). However, since a plasma atmosphere is occurred during an arc discharge at the time of producing the crucible, the discharge is generated violently around an electrode when the electrode is charged in positive. In addition, from the reason, such as the insulation between the arc plasma and the mold is not sufficiently, it is difficult to carry out the electrolytic refining sufficiently. By the way, in the case that the silica powder is filled in the mold to be heated and melted to make the crucible, since the upper end of the mold and the upper end of the crucible are the same height, it is difficult to take an electrical isolation between the arc plasma and the mold in this configuration.

In addition, the following methods and device have been also known. That is, the method comprises, heating the melted silica glass, applying direct current voltage of from 10 to 50 KV to said heated glass, and removing the alkali metals or Cu (Japanese Patent Publication No. H07-014822). The method comprises, pulverizing a natural quartz crystal, refining it, carrying out the arc melting to form the crucible, and applying the high voltage to said crucible (Japanese Patent Publication No. H07-080716). The device comprises, applying the voltage to the silica glass formed body and removing the impurities (Japanese Patent Publication No. H06-104577). However, all of these methods in the above examples are aimed at the crucible being formed already, so that they are not the electrolytic refining during the arc melting.

Moreover, the method for applying the voltage between the crucible and the positive or negative electrode is not described in said conventional methods. However, in the method, in which the crucible formed body is contacted with the positive or negative electrode and applied by the voltage, it is difficult to carry out electrolysis because of the following reasons.

(A) When the metal plate is used as the contact electrode, the impurity contamination is caused to decrease the quality and the dislocation free ratio of the single silicon crystal.

(B) When the powder, such as carbon etc., is used as the contact electrode, the carbon powder is reacted with the silica glass and its surface becomes an irregular under the temperature more than 1100 degree C., so that the dislocation free ratio of the single silicon crystal is decreased.

(C) In the conventional method, in which the voltage is applied to the silica glass formed body, the voltage applying is carried out at the temperature not deforming the crucible, i.e. less than 1400 degree C., and when the silica powder is used as the negative electrode and the crucible has the silica powder layer of form 5 to 30 mm, the applied voltage is almost inclined to the silica powder layer, so that the alkali metals etc. in the inside of crucible is not moved. At this time, in order to carry out the economical electrolysis, it is necessary to apply the voltage at least 30000 V, and it is very difficult technically to insulate such a high voltage at the high temperature.

SUMMARY OF THE INVENTION

[Means to Solve the Problems]

The present invention solves the above-described problems in the conventional electrolytic refining. In addition, as for the producing silica crucible, the present invention relates to the production method, in which the impurity concentration in the inside of crucible is decreased, and its silica crucible.

According to the present invention, the following production methods of the high purity silica crucible are proposed.

[1] A production method of a high purity silica glass crucible, wherein a purity of the melted silica glass layer is increased by applying a voltage between a mold and an arc electrode to move impurity metals being contained in the melted silica glass layer to the outside of crucible, when the silica crucible is produced by arc plasma heating the raw material powder of the silica in an inside surface of a hollow rotary mold, the method comprising;
  carrying out an arc melting until a thickness of the formed glass layer becoming more than 5 mm and a thickness of the un-melted silica layer becoming less than 2 mm,
  keeping an arc electrode potential within ±500 V during the arc melting, and
  applying the voltage from −1000 V to −20000 V to the mold being insulated to the ground.

[2] The production method according to above [1], wherein a resistance of the un-melted silica glass layer and the formed glass layer is less than 50000 Ω.

[3] The production method according to above [1] or [2], wherein the quantity of electricity flowing during said voltage applying is more than 13 C/m$^2$.

[4] The production method according to above [1], [2], or [3], the method comprising;
  applying the voltage to the melted silica glass while heating the silica crucible under more than 1900 degree C., to decrease the impurity in less than 1 mm from the inside surface of the crucible.

[5] The production method according to any one of from above [1] to [4],
  wherein the time for applying said voltage is less than 70% to the time for the arc melting, and applying time zone is between the middle stage and the final stage of the arc melting.

[6] The production method according to any one of from above [1] to [5], the method comprising;
  isolating between the arc electrode and the mold by
  covering substantially an upper end of the mold facing to the arc electrode with the silica glass, or
  installing a silica ring having a height more than 50 mm from the upper end of the mold along with an inner circumference of the mold.

[7] The production method according to any one of from above [1] to [6], the method comprising;
  applying said voltage at the time of arc melting the raw material powder of the silica being accumulated on the inside surface of the mold, and/or feeding said powder to the inside surface of the mold.

Moreover, the present invention relates to the following high purity silica crucible, and the pulling method using said silica crucible.

[8] A silica glass crucible for pulling a single silicon crystal being produced by the any one method of from above [1] to [7],
  wherein at least each content of Na and Li being contained in the depth of 1 mm from the inside surface is less than 0.05 ppm respectively.

[9] A silica glass crucible for pulling a single silicon crystal being produced by the any one method of from above [1] to [7],
  wherein a natural silica powder is used in the outside of crucible, a high purity synthetic silica powder is used in the inside of crucible, and at least each content of Na and Li being contained in the depth of 1 mm from the inside surface is less than 0.05 ppm respectively.

[10] The silica glass crucible according to above [8] or [9],
  wherein each content of Na, Li, K, and Fe being contained in the depth of 1 mm from the inside surface is less than 0.05 ppm respectively, and Cu is less than 0.01 ppm.

[11] A pulling method of a single silicon crystal,
  wherein the silica glass crucible of any one according to from claim 1 to claim 10 is used when the single silicon crystal is pulled.

BRIEF DESCRIPTION OF THE DRAWINGS

[FIG. 1]: A conceptual figure showing a device constitution carrying out the present invention.

[FIG. 2]: A conceptual figure showing an insulation method of the crucible.

[FIG. 3]: A conceptual figure showing the insulation method of the crucible.

[Explanation of Codes]: 10: Mold, 11: Rotary Table, 12: Insulation Material, 13: Electrode, 14: Power Supply, 20, 21: Silica Glass Substance

DETAILED DESCRIPTION OF THE PREFERRED EMBODIMENT

The production method of the present invention is the production method of the high purity silica glass crucible, wherein the purity of the melted silica glass layer is increased by applying the voltage between the mold and the arc electrode to move the impurity metals being contained in the melted silica glass layer to the outside of crucible, when the silica crucible is produced by arc plasma heating the raw material powder of the silica in an inside surface of the hollow rotary mold, the method comprising; carrying out the arc melting until the thickness of the formed glass layer becoming more than 5 mm and a thickness of the un-melted silica powder layer becoming less than 2 mm, keeping the arc electrode potential of within ±500 V during the arc melting, and applying the voltage from −1000V to −20000 V to the mold being insulated to the ground.

As for the method of the present invention, the mold being made from carbon is applied to the negative (−) to the earth. If the electrode is made to the positive (+), it is difficult to carry out the electrolysis because of the discharging to the around. Moreover, the arc electrode potential is kept within ±500 V, and the electrolytic voltage from −1000 V to −20000 V is applied to the mold being insulated to the ground. If arc electrode potential is more than ±500 V, the potential difference of the arc electrode and the mold becomes small, and moving of the impurity becomes slow. In addition, if the voltage is too high, it is difficult to insulate the mold etc., so that it is preferable that said voltage is less than 20000 V.

When the crucible is produced, it is preferable that the arc melting is carried out until the thickness of the formed glass layer becoming more than 5 mm and the thickness of the un-melted silica powder layer becoming less than 2 mm, preferably less than 1 mm, and the electrolytic voltage is applied during the arc melting. If the thickness of the un-melted silica powder layer is more than 2 mm, the effect of refining the impurities in the part of the inside surface of the crucible is insufficient. In addition, if the thickness of the formed glass layer is less than 5 mm, it is insufficient as the product.

In the production method of the present invention, it is preferable that the resistance of the un-melted silica powder layer and the formed glass layer is less than 50000 Ω. Moreover, it is suitable that the quantity of electricity flowing during said voltage applying is more than 13 C/m², preferably more than 15 C/m². If said resistance is more than 50000 Ω, it is difficult to economically move the impurities, such as alkali metals or copper, existing under the network structure of the glass. If said resistance is less than 50000 Ωand the quantity of the flowing electricity is more than 13 C /m², preferably more than 15 C/m², the quantity of the impurities being moved to the outside of the crucible becomes to be more than the quantity of the impurities being concentrated in the range of 1 mm of the inside surface by vaporizing silica, so that it is possible to be high purity in said range.

It is preferable that said voltage is applied to the melted silica glass while heating at more than 1900 degree C. If the melting temperature is less than 1900 degree C., the effect of refining the inside surface portion of the crucible is insufficient. Moreover, it is preferable that the time for applying said voltage is more than 70% to the time for the arc melting, and the applying time zone is between the middle stage and the final stage of the arc melting. In general, the producing process of the crucible comprising the each process of (1) making the form, (2) venting the bubbles, and (3) smoothing the surface. However, when the electrolysis is carried out in early stages in the process, the viscosity of the glass is too high, so that it is difficult to smooth the surface of the crucible after venting the bubble.

An example of the device using the production method by the electrolytic refining of the present invention is shown in FIG. 1. As for the device being shown in FIG. 1, a mold 10 is placed on a rotary table 11, and an insulation material 12 is interposed between the mold 10 and the rotary table 11. An electrode 13 for applying the voltage to the mold 10 is contacted with the mold 10, and the electrode 13 is earthed to the ground to be connected with a power supply 14.

In order to insulate sufficiently between an arc electrode (not shown in FIG. 1), which heats and melts the raw material powder of the silica, and the mold 10, it is preferable that the upper end of the mold facing to the arc electrode is covered substantially with a silica glass 20 as shown in FIG. 2, or a silica glass ring 21 having the height of more than 50 mm is installed along with an inner circumference of the mold 10 from the upper end of said mold 10 as shown in FIG. 3.

The production method of the present invention can be used not only in the case that the raw material powder of the silica being accumulated on the inside of the mold is arc melted, but also in the case that the raw material powder of the silica is feeding to be melt to the inside of the mold. Moreover, said production method can be used also in the case that the natural silica powder, in which the concentration of Na, K, Li, and Fe being contained as impurities is more than 0.1 ppm, is used on the outside of crucible, and the high purity synthetic silica powder is used on the inside of crucible.

A brown ring, which is generated on the surface of the crucible by the reaction of Si with $SiO_2$ at the time of pulling the single silicon crystal, peels off during the pulling, and decreases a dislocation free ratio, so it is desirable that there are few brown rings as much as possible. The density of the brown ring is depended on the impurity concentration on the surface of the glass. However, as for the silica glass crucible of the present invention, since the purity of the surface layer of the crucible becomes high by the above-described electrolytic refining and the impurities becomes very low, the brown ring hardly occurs, thus the high dislocation free ratio can be obtained.

[Effectiveness of the Invention]

According to said production method of the present invention, it is possible to give the silica glass crucible, in which each content of Na and Li being contained in the area of depth 1 mm from the inside surface are less than 0.05 ppm, preferably less than 0.01 ppm. Moreover, as for the silica glass crucible being shown in Example, each concentration of K and Fe are reduced to less than 0.05 ppm other than Na and Li, and the concentration of Cu is reduced to less than 0.01 ppm. This crucible is suitable as the silica glass crucible for pulling the single silicon crystal.

EXAMPLE

Hereinafter, the present invention will be explained with Example and Comparison example.

Examples 1 and 2

The silica glass crucible is produced by using the raw material powder of natural silica being shown in Table 1, and applying the voltage under the conditions of from Table 2 to Table 5. These results are shown in from Table 2 to Table 5 (Example 1).

The silica glass crucible is produced by using the raw material powder of natural silica being shown in Table 6, and applying the voltage under the conditions of from Table 7 to Table 10. These results are shown in from Table 6 to Table 10(Example 2).

TABLE 1

| ppm | Na | Li | K | Cu | Fe |
|---|---|---|---|---|---|
| Raw Material Powder | 0.23 | 0.25 | 0.22 | 0.15 | 0.22 |

TABLE 2

| | Thickness of Un-melted Silica Powder (mm) | Melting Temperature (° C.) | Resistance (Ω) | Electricity Amount (C/m2) | Area of less than 1 mm From Inside Surface | | | | | Dislocation free ratio (%) |
|---|---|---|---|---|---|---|---|---|---|---|
| | | | | | Na | Li | K | Cu | Fe | |
| Example 1A | 0.5 | 2200 | 50000 | 15 | <0.01 | <0.01 | 0.02 | <0.01 | 0.02 | 85 |
| Example 2A | 2 | 2200 | 50000 | 15 | <0.01 | <0.01 | 0.03 | <0.01 | 0.03 | 84 |
| Comparison Example 1A | 3 | 2200 | 50000 | 15 | 0.33 | 0.27 | 0.27 | 0.21 | 0.24 | 52 |
| Comparison Example 2A | 5 | 2200 | 50000 | 15 | 0.33 | 0.31 | 0.36 | 0.26 | 0.35 | 47 |

(Notice) Resistance is sum of a resistance of an un-melted silica powder layer and a formed glass layer.

TABLE 3

|  | Thickness of Un-melted Silica Powder (mm) | Melting Temperature (° C.) | Resistance (Ω) | Electricity Amount (C/m2) | Area of less than 1 mm From Inside Surface | | | | | Dislocation free ratio (%) |
| --- | --- | --- | --- | --- | --- | --- | --- | --- | --- | --- |
|  |  |  |  |  | Na | Li | K | Cu | Fe |  |
| Example 1B | 2 | 2200 | 50000 | 15 | <0.01 | <0.01 | 0.03 | <0.01 | 0.03 | 85 |
| Comparison Example 1B | 2 | 2200 | 70000 | 15 | 0.33 | 0.31 | 0.3 | 0.24 | 0.31 | 43 |
| Comparison Example 2B | 2 | 2200 | 100000 | 15 | 0.3 | 0.38 | 0.38 | 0.28 | 0.38 | 45 |

(Notice) Resistance is sum of the resistance of the un-melted silica powder layer and the formed glass layer.

TABLE 4

|  | Thickness of Un-melted silica Powder (ppm) | Melting Temperature (° C.) | Resistance (Ω) | Electricity Amount (C/m2) | Area of less than 1 mm From Inside Surface | | | | | Dislocation free ratio (%) |
| --- | --- | --- | --- | --- | --- | --- | --- | --- | --- | --- |
|  |  |  |  |  | Na | Li | K | Cu | Fe |  |
| Example 1C | 2 | 1900 | 50000 | 15 | 0.01 | 0.01 | 0.02 | <0.01 | 0.02 | 84 |
| Comparison Example 1C | 2 | 1850 | 50000 | 15 | 0.24 | 0.28 | 0.24 | 0.18 | 0.24 | 50 |
| Comparison Example 2C | 2 | 1800 | 50000 | 15 | 0.28 | 0.34 | 0.29 | 0.22 | 0.26 | 29 |

(Notice) Resistance is sum of the resistance of the un-melted silica powder layer and the formed glass layer.

TABLE 5

|  | Thickness of Un-melted Silica Powder (ppm) | Melting Temperature (° C.) | Resistance (Ω) | Electricity Amount (C/m2) | Area of less than 1 mm From Inside Surface | | | | | Dislocation free ratio (%) |
| --- | --- | --- | --- | --- | --- | --- | --- | --- | --- | --- |
|  |  |  |  |  | Na | Li | K | Cu | Fe |  |
| Example 1B | 2 | 2200 | 50000 | 15 | <0.01 | <0.01 | 0.02 | <0.01 | 0.03 | 91 |
| Comparison Example 1B | 2 | 2200 | 50000 | 10 | 0.25 | 0.31 | 0.31 | 0.25 | 0.3 | 33 |
| Comparison Example 2B | 2 | 2200 | 50000 | 5 | 0.27 | 0.31 | 0.29 | 0.26 | 0.3 | 33 |

(Notice) Resistance is sum of the resistance of the un-melted silica powder layer and the formed glass layer.

TABLE 6

|  | Na | Li | K | Cu | Fe |
| --- | --- | --- | --- | --- | --- |
| Natural | 0.23 | 0.25 | 0.22 | 0.15 | 0.22 |
| Synthetic | <0.01 | <0.01 | <0.01 | <0.01 | <0.01 |

TABLE 7

|  | Thickness of Un-melted Silica Powder (mm) | Melting Temperature (° C.) | Resistance (Ω) | Electricity Amount (C/m2) | Area of less than 1 mm From Inside Surface | | | | | Dislocation free ratio (%) |
| --- | --- | --- | --- | --- | --- | --- | --- | --- | --- | --- |
|  |  |  |  |  | Na | Li | K | Cu | Fe |  |
| Example 1E | 0.5 | 2200 | 50000 | 15 | <0.01 | <0.01 | <0.01 | <0.01 | <0.01 | 92 |
| Example 2E | 2 | 2200 | 50000 | 15 | <0.01 | <0.01 | <0.01 | <0.01 | <0.01 | 93 |
| Comparison Example 1E | 3 | 2200 | 50000 | 15 | 0.07 | 0.1 | 0.7 | 0.06 | 0.06 | 43 |
| Comparison Example 2E | 5 | 2200 | 50000 | 15 | 0.99 | 0.12 | 0.9 | 0.07 | 0.08 | 38 |

(Notice) Resistance is sum of the resistance of the un-melted silica powder layer and the formed glass layer.

TABLE 8

| | Thickness of Un-melted Silica Powder (ppm) | Melting Temperature (° C.) | Resistance (Ω) | Electricity Amount (C/m2) | Area of less than 1 mm From Inside Surface | | | | | Dislocation free ratio (%) |
|---|---|---|---|---|---|---|---|---|---|---|
| | | | | | Na | Li | K | Cu | Fe | |
| Example 1F | 2 | 2200 | 50000 | 15 | <0.01 | <0.01 | <0.01 | <0.01 | <0.01 | 93 |
| Comparison Example 1F | 2 | 2200 | 70000 | 15 | 0.06 | 0.09 | 0.06 | 0.06 | 0.07 | 49 |
| Comparison Example 2F | 2 | 2200 | 100000 | 15 | 0.1 | 0.14 | 0.08 | 0.08 | 0.09 | 45 |

(Notice) Resistance is sum of the resistance of the un-melted silica powder layer and the formed glass layer.

TABLE 9

| | Thickness of Un-melted Silica Powder (ppm) | Melting Temperature (° C.) | Resistance (Ω) | Electricity Amount (C/m2) | Area of less than 1 mm From Inside Surface | | | | | Dislocation free ratio (%) |
|---|---|---|---|---|---|---|---|---|---|---|
| | | | | | Na | Li | K | Cu | Fe | |
| Example 1G | 2 | 1900 | 50000 | 15 | <0.01 | <0.01 | <0.01 | <0.01 | <0.01 | 90 |
| Comparison Example 1G | 2 | 1850 | 50000 | 15 | 0.07 | 0.09 | 0.08 | 0.06 | 0.06 | 39 |
| Comparison Example 2G | 2 | 1800 | 50000 | 15 | 0.16 | 0.18 | 0.12 | 0.09 | 0.09 | 29 |

(Notice) Resistance is sum of the resistance of the un-melted silica powder layer and the formed glass layer.

TABLE 10

| | Thickness of Un-melted Silica Powder (ppm) | Melting Temperature (° C.) | Resistance (Ω) | Electricity Amount (C/m2) | Area of less than 1 mm From Inside Surface | | | | | Dislocation free ratio (%) |
|---|---|---|---|---|---|---|---|---|---|---|
| | | | | | Na | Li | K | Cu | Fe | |
| Example 1H | 2 | 2200 | 50000 | 15 | <0.01 | <0.01 | <0.01 | <0.01 | <0.01 | 91 |
| Comparison Example 1H | 2 | 2200 | 50000 | 10 | 0.06 | 0.08 | 0.06 | 0.05 | 0.06 | 31 |
| Comparison Example 2H | 2 | 2200 | 50000 | 5 | 0.08 | 0.09 | 0.07 | 0.06 | 0.07 | 29 |

(Notice) Resistance is sum of the resistance of the un-melted silica powder layer and the formed glass layer.

What is claimed is:

1. A production method of a high purity silica glass crucible, wherein a purity of the melted silica glass layer is increased by applying a voltage between a mold and an arc electrode to move impurity metals being contained in the melted silica glass layer to the peripheral side, when the silica glass crucible is produced by arc plasma heating a raw material powder of the silica in an inside of a hollow rotary mold, the method comprising:
  carrying out an arc melting until a thickness of the formed glass layer becoming more than 5 mm and a thickness of the un-melted silica powder layer becoming less than or equal to 2 mm,
  keeping an arc electrode potential within ±500 V during the arc melting, and applying the voltage from −1000 V to −20000 V to the mold being insulated to the ground.

2. The production method according to claim 1, wherein a resistance of the un-melted silica powder layer and the formed glass layer is less than 50000 Ω.

3. The production method according to claim 1, wherein the quantity of electricity flowing during said voltage applying is more than 13 C/m$^2$.

4. The production method according to claim 1, the method comprising:
  applying the voltage to the melted silica glass while heating the silica glass crucible at more than 1900 degree C., to decrease the impurity in the depth of less than 1 mm from the inside surface of the crucible.

5. The production method according to claim 1, wherein the time for applying said voltage is less than 70% to the whole time for the arc melting, and said applying time zone is between the middle stage and the final stage of the arc melting.

6. The production method according to claim 1, the method comprising:
  isolating between the arc electrode and the mold by
    covering substantially an upper end of the mold facing to the arc electrode with the silica glass, or
    installing a silica ring having a height of more than 50 mm from the upper end of the mold along with an inner circumference of the mold.

7. The production method according to claim 1, the method comprising:
  the natural silica powder, in which the concentration of Na, K, Li, and Fe being contained as impurities is more than 0.1 ppm, is accumulated on the inside surface of the mold, and the high purity synthetic silica powder is accumulated onto the natural silica powder.

8. A silica glass crucible for pulling a silicon single crystal being produced by claim 1, wherein at least each content of Na and Li being contained in the depth of 1 mm from the inside surface is less than 0.05 ppm respectively.

9. A silica glass crucible for pulling a silicon single crystal being produced by claim 1, wherein each content of Na, Li, K, and Fe being contained in the depth of 1 mm from the inside surface is less than 0.05 ppm respectively, and Cu being contained in said depth is less than 0.01 ppm.

10. A silica glass crucible for pulling a silicon single crystal being produced by claim 7, wherein a natural silica powder is used in the outside of crucible, a high purity synthetic silica powder is used in the inside of crucible, and at least each content of Na and Li being contained in the depth of 1 mm from the inside surface is less than 0.05 ppm respectively.

11. The production method according to claim 1, the method comprising:

the high purity silica powder layer is accumulated on the inside surface of the mold, and, as heating said layer by arc plasma, the high purity synthetic silica powder is fed and its melt is deposited onto said layer.

12. The production method according to claim 11, wherein a resistance of the un-melted silica powder layer and the formed glass layer is less than 50000 Ω.

13. The production method according to claim 11, wherein the quantity of electricity flowing during said voltage applying is more than 13 $C/m^2$.

14. The production method according to claim 11, the method comprising:

applying the voltage to the melted silica glass while heating the silica glass crucible at more than 1900 degree C., to decrease the impurity in the depth of less than 1 mm from the inside surface of the crucible.

15. The production method according to claim 11, wherein the time for applying said voltage is less than 70% to the whole time for the arc melting, and said applying time zone is between the middle stage and the final stage of the arc melting.

16. The production method according to claim 11, the method comprising:

isolating between the arc electrode and the mold by covering substantially an upper end of the mold facing to the arc electrode with the silica glass, or installing a silica ring having a height of more than 50 mm from the upper end of the mold along with an inner circumference of the mold.

17. A silica glass crucible for pulling a silicon single crystal being produced by claim 11, wherein each content of Na, Li, K, and Fe being contained in the depth of 1 mm from the inside surface is less than 0.05 ppm respectively, and Cu being contained in said depth is less than 0.01 ppm.

18. A silica glass crucible for pulling a silicon single, crystal being produced by claim 11, wherein a natural silica powder is used in the outside of crucible, a high purity synthetic silica powder is used in the inside of crucible, and at least each content of Na and Li being contained in the depth of 1 mm from the inside surface is less than 0.05 ppm respectively.

* * * * *